(12) United States Patent
Sisodia et al.

(10) Patent No.: US 10,861,575 B2
(45) Date of Patent: Dec. 8, 2020

(54) MEMORY WITH A CONTROLLABLE I/O FUNCTIONAL UNIT

(71) Applicant: Arm Limited, Cambridge (GB)

(72) Inventors: Rajiv Kumar Sisodia, Bangalore (IN); Renu Rawat, Bangalore (IN); Paul Darren Hoxey, Cambridge (GB); Vikash, Bangalore (IN); Kumaraswamy Ramanathan, Austin, TX (US); Sanjay Mangal, Austin, TX (US); Yew Keong Chong, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/666,164

(22) Filed: Oct. 28, 2019

(65) Prior Publication Data

US 2020/0066365 A1    Feb. 27, 2020

Related U.S. Application Data

(63) Continuation of application No. 15/684,239, filed on Aug. 23, 2017, now Pat. No. 10,460,822.

(51) Int. Cl.
| | |
|---|---|
| *G11C 29/12* | (2006.01) |
| *G11C 11/418* | (2006.01) |
| *G11C 11/419* | (2006.01) |
| *G11C 7/10* | (2006.01) |
| *G11C 29/32* | (2006.01) |
| *G11C 5/06* | (2006.01) |

(52) U.S. Cl.
CPC ........ *G11C 29/1201* (2013.01); *G11C 7/1018* (2013.01); *G11C 11/418* (2013.01); *G11C 11/419* (2013.01); *G11C 29/12015* (2013.01); *G11C 29/32* (2013.01); *G11C 5/066* (2013.01); *G11C 7/1036* (2013.01); *G11C 2029/1204* (2013.01); *G11C 2207/107* (2013.01)

(58) Field of Classification Search
CPC .......... G11C 29/1201; G11C 29/12015; G11C 29/32; G11C 7/1018; G11C 7/1036; G11C 11/418; G11C 11/419; G11C 5/066; G11C 2029/1204; G11C 2029/107
USPC ......................................................... 365/154
See application file for complete search history.

(56) References Cited

U.S. PATENT DOCUMENTS

| | | | | | |
|---|---|---|---|---|---|
| 5,383,143 | A | * | 1/1995 | Crouch ............ | G01R 31/31813 708/254 |
| 5,588,006 | A | * | 12/1996 | Nozuyama ..... | G01R 31/318547 714/703 |
| 5,663,966 | A | * | 9/1997 | Day ............... | G01R 31/318541 714/731 |

(Continued)

*Primary Examiner* — Sung Il Cho
(74) *Attorney, Agent, or Firm* — Pramudji Law Group PLLC; Ari Pramudji

(57) ABSTRACT

A circuit includes a bitcell array having a plurality of bitlines, and an I/O functional unit to read data stored in the bitcell array. The I/O functional unit includes a first multiplexer to select a first input port or a first bitline among a first group of bitlines, a first latch to latch the output of the first multiplexer, a second multiplexer to select a second input port or a second bitline among a second group of bitlines. The second input port is coupled to an output port of the first latch. The I/O functional unit further includes a second latch to latch the output of the second multiplexer.

19 Claims, 3 Drawing Sheets

(56) References Cited

U.S. PATENT DOCUMENTS

| | | | | |
|---|---|---|---|---|
| 5,754,758 A * | 5/1998 | Baeg | ............... | G11C 29/32 |
| | | | | 714/30 |
| 5,917,832 A * | 6/1999 | Baeg | ............... | G11C 29/32 |
| | | | | 714/718 |
| 5,943,252 A * | 8/1999 | Schultz | ............ | G11C 15/04 |
| | | | | 365/49.15 |
| 5,951,702 A * | 9/1999 | Lim | ................ | G11C 29/04 |
| | | | | 365/200 |
| 6,131,173 A * | 10/2000 | Meirlevede | ...... | G01R 31/31859 |
| | | | | 714/726 |
| 6,490,702 B1 * | 12/2002 | Song | ............ | G01R 31/318541 |
| | | | | 714/726 |
| 7,707,472 B1 * | 4/2010 | Dastidar | ........... | G11C 29/32 |
| | | | | 714/733 |
| 2002/0194558 A1 * | 12/2002 | Wang | ............ | G11C 29/16 |
| | | | | 714/718 |
| 2003/0093744 A1 * | 5/2003 | Leung | ............ | G06F 11/1048 |
| | | | | 714/763 |
| 2006/0174175 A1 * | 8/2006 | Huott | ............ | G01R 31/318572 |
| | | | | 714/726 |
| 2007/0230255 A1 * | 10/2007 | Fukuda | ........... | G11C 7/20 |
| | | | | 365/189.05 |
| 2008/0117092 A1 * | 5/2008 | Wolf | ............ | H03M 1/168 |
| | | | | 341/161 |
| 2011/0072323 A1 * | 3/2011 | Chong | ............ | G11C 29/32 |
| | | | | 714/719 |
| 2017/0366185 A1 * | 12/2017 | Xiao | ............ | H01L 23/544 |
| 2018/0025757 A1 * | 1/2018 | Chan | ............ | G11C 7/1045 |
| | | | | 365/189.02 |
| 2018/0076231 A1 * | 3/2018 | Yamazaki | ........... | H01L 27/1255 |
| 2018/0096648 A1 * | 4/2018 | Kurokawa | ........... | G06F 1/3265 |

* cited by examiner

MEMORY WITH A CONTROLLABLE I/O FUNCTIONAL UNIT

RELATED APPLICATIONS

This patent application is a Continuation of U.S. patent application Ser. No. 15/684,239, filed 2017 Aug. 23 and titled A MEMORY WITH A CONTROLLABLE I/O FUNCTIONAL UNIT, the entire disclosure of which is incorporated herein by reference.

BACKGROUND

A self-timing path (or circuit) helps provide reliable, high-speed read or write operations on a memory, such as an SRAM (Static Random Access Memory). A self-timing path is used to control the pulse width of an internal clock signal within the memory, which in turn controls sense amplifiers and latches for reading from or writing to a bitcell array within the memory. By tracking column and row performance of the bitcell array, the appropriate latches and sense amplifiers can be enabled at the correct time to facilitate a reliable read or write operation. Improvement in column and row tracking can improve memory performance.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit implementations of various techniques described herein.

DESCRIPTION

In the description that follows, the scope of the term "some implementations" is not to be so limited as to mean more than one implementation, but rather, the scope may include one implementation, more than one implementation, or perhaps all implementations.

Various implementations described herein provide for the efficient use of chip-area in a memory device to realize one or more scan chains as part of a built-in self-test (BIST) circuit. Latches in I/O functional units of a memory device are configured into a scan chain during a test (or scan) operation.

Figure 1:
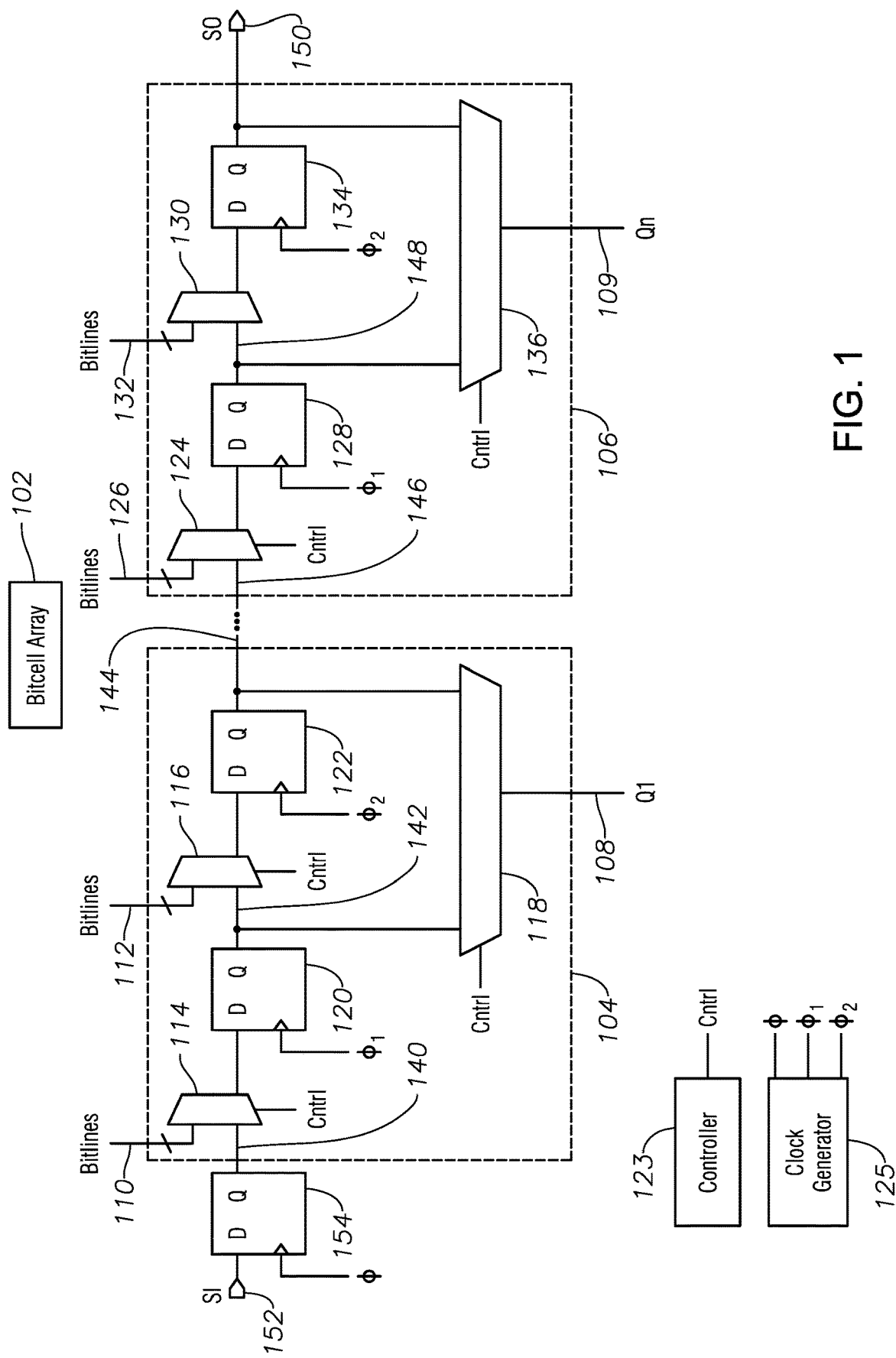
FIG. 1 illustrates a memory and peripheral circuits in accordance with various implementations described herein.

FIG. 1 illustrates a memory, such as for example an SRAM, comprising a bitcell array 102 and peripheral circuits. For ease of illustration, not all functional components of a memory are illustrated, such as for example sense amplifiers, address decoders, wordlines, and other well-known components. The peripheral circuits illustrated in FIG. 1 are employed to read data stored in the bitcell array 102.

The peripheral circuits are grouped into a plurality of I/O functional units, where for ease of illustration only two I/O functional units are illustrated: an I/O functional unit 104 and an I/O functional unit 106. During a normal (non-test or non-scan) read operation of the memory, an I/O functional unit provides data on an output port, where the data is read from a particular bitline of the bitcell array 102 according to a control signal, denoted as Cntrl in FIG. 1. In the particular implementation illustrated in FIG. 1, during a read operation the I/O functional unit 104 provides on an output port 108 a data element denoted in FIG. 1 as Q1, and the I/O functional unit 106 provides on an output port 109 a data element denoted in FIG. 1 as Qn, where n denotes an integer representing the number of I/O functional units, including the I/O functional units 104 and 106.

The data element Q1 refers to a particular data element provided by one of the bitlines connected to the I/O functional unit 104. These bitlines are grouped into two groups: a first group of bitlines denoted by a multi-signal line 110, and a second group of bitlines denoted by a multi-signal line 112. For example, the multi-signal line 110 and the multi-signal line 112 may each consist of eight signal lines, so that a total of 16 bitlines are connected to the I/O functional unit 104. The I/O functional unit 104 includes multiplexers 114, 116, and 118, and latches 120 and 122 for selecting and providing the bitline value Q1 to the output port 108. A controller 123 provides a control signal "Cntrl" to the multiplexers 114, 116, and 118 to select a bitline value (Q1) among the multi-signal lines 114 and 116.

The I/O functional unit 104 may be viewed as a two-tier (or two-level) multiplexer system for selecting a particular bitline among the multiple bitlines connected to the multiplexers 114 and 116. The combination of multiplexers 114 and 116 and latches 120 and 122 may be identified as a first tier (or first level), and the multiplexer 118 may be identified as a second tier (or second level). The latch 120 is clocked by a clock signal $\phi 1$ and the latch 122 is clocked by a clock signal $\phi 2$. During normal operation (non-test or non-scan mode) of the memory, the clock signals $\phi 1$ and $\phi 2$ are the same clock signal, which may be denoted as a clock signal $\phi$. (It is convenient to use distinct symbols when discussing the memory in a test or scan mode.) A clock generator 125 provides the clock signals $\phi 1$, $\phi 2$, and $\phi$.

Depending upon the state of the control signal Cntrl, the multiplexer 114 selects one of the bitlines among the multi-signal line 110 as an output value to provide to the input port of the latch 120, and the multiplexer 116 selects one of the bitlines among the multi-signal line 112 as an output value to provide to the input port of the latch 122. The values latched by the latches 120 and 122 are provided at their respective output ports, and in turn are provided as the input port values to the multiplexer 118. The multiplexer 118 selects one of its input port values as the output port value Q1, where the selection is dependent upon the state of the control signal Cntrl.

Distinct symbols could be used for the control signals to the multiplexers 114, 116, and 118, with the controller 123 providing each control signal. However, for ease of illustration it is convenient to lump these control signals into the same symbol Cntrl. It is understood that the term "control signal" for a multiplexer includes one or more distinct control signals for one or more multiplexers.

The other I/O functional units operate in the same manner as the I/O functional unit 104. For example, the I/O functional unit 106 includes a multiplexer 124 to select a bitline among a multi-signal line 126 to provide its bit value to an input port of a latch 128, and a multiplexer 130 to select a bitline among a multi-signal line 132 to provide its bit value to an input port of a latch 134. A multiplexer 136 selects one of the output port values of the latches 128 and 134 according to the control signal Cntrl to provide the data element Qn on the output port 109.

The two-tier architecture of the I/O functional units illustrated in FIG. 1 provides for the reduction in capacitive loading on the multiplexers. For example, by grouping bitlines into two groups as indicated by the multi-signal lines 110 and 112, the number of bitlines loading the input ports of a multiplexer are halved when compared to an architecture in which all such bitlines feed into a single multiplexer. The two-tier architecture includes latches in the first tier (e.g., the latches 120 and 122 in the I/O functional unit 104) so that a multiplexer in the second tier (e.g., the multiplexer 118) can select a single bitline value. Various implementations described herein take advantage of the latches in the first tier when the memory is in a test (or scan) mode, as discussed below.

During a test mode of the memory illustrated in FIG. 1, stored data values in the bitcell array 102 are read out in a scan chain, or the peripheral circuit alone can be tested with data fed into the scan chain. When in a test mode, the latches in the first tier of each I/O functional unit are configured as a flip-flop, where a first latch in the first tier is configured as a master latch and a second latch in the first tier is configured as a slave latch.

Referring to the I/O functional unit 104 in FIG. 1, when in a test (or scan) mode the clock generator 125 clocks the latch 120 as a master latch and clocks the latch 122 as a slave latch. The clock generator 125 drives the clock signals $\phi 1$ and $\phi 2$ such that they are 180° out of phase with respect to each other. The controller 123 sets the control signal Cntrl so that the multiplexer 114 selects an input port 140 and the multiplexer 116 selects an input port 142. This configuration is repeated among the I/O functional units so that they form a scan chain.

For example, an output port 144 of the latch 122 is selected as an input to the next I/O functional unit immediately following the I/O functional unit 104, where the latches in this next I/O functional unit are configured as master and slave latches as discussed with respect to the I/O functional unit 104. The last I/O functional unit in the scan chain (the I/O functional unit 106) likewise is configured where the controller 123 sets the control signal Cntrl such that the multiplexer 124 selects an input port 146, where the input port 146 is connected to the output port of the slave latch in the immediately preceding I/O functional unit. Likewise, the controller 123 sets the multiplexer 130 so that it selects an input port 148, which is connected to the output port of the latch 128. The clock generator 125 drives the clock signals $\phi 1$ and $\phi 2$ such the latches 128 and 134 are operated as master and slave, respectively. With the I/O functional units configured as a scan chain, the data stored in the latches are clocked out of an output port 150, also labeled SO.

In an implementation, the I/O functional units in FIG. 1 are configured into a scan chain after data read from the bitcell array 102 have been latched into the various latches. When the I/O functional units are then configured and operated as a scan chain, the latched data is read out sequentially at the output port 150. In another implementation, input data is fed into an input port 152 of a flip-flop 154, clocked by the clock signal $\phi$. An output port of the flip-flop 154 is connected to the input port 140 of the multiplexer 114. The controller 123 may synchronize the clock signal $\phi$ to the clock signal $\phi 1$ so that the input data latched by the flip-flop 154 is available to the latch 120 when the latch 120 is ready to latch its input. In this way, the input data fed into the input port 152 is eventually read at the output port 150 so that the peripheral circuit alone is tested (without necessarily testing the bitcell array 102).

Figure 2:
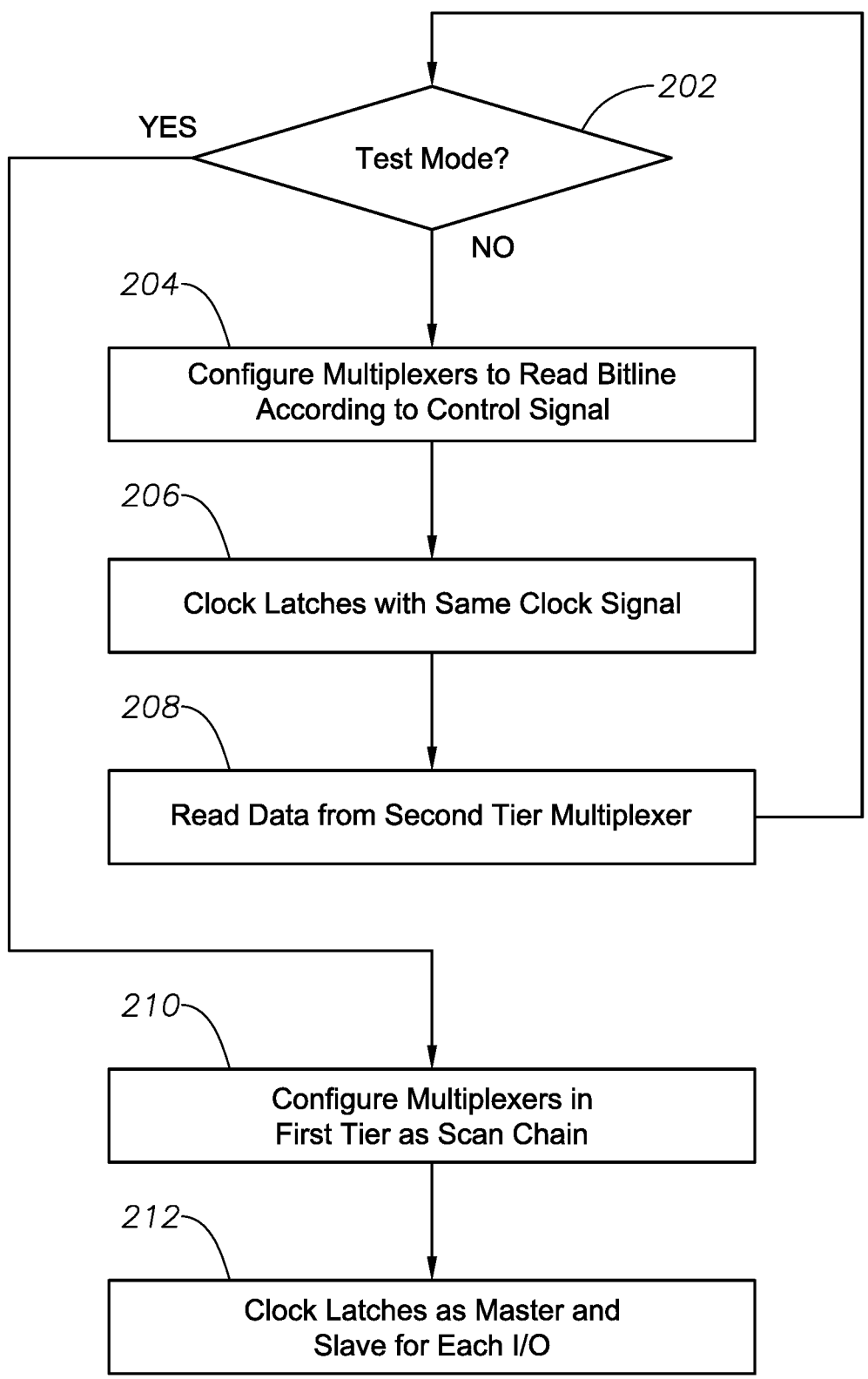
FIG. 2 illustrates a flow diagram for configuring a scan chain in a memory in accordance with various implementations described herein.

FIG. 2 illustrates a flow diagram for configuring the I/O functional units as described with respect to FIG. 1. Step 202 determines whether the memory is in a test mode or in normal operation. When in normal operation, step 204 indicates that the multiplexers in each I/O functional unit are configured to read data from a selected bitline. As described previously, each I/O functional unit is a two-tier system in which there are two multiplexers and latches in a first tier and one multiplexer in a second tier. For each I/O functional unit, the latches are clocked by the same clock signal (step 206), and data retrieved from a bitcell array are read out as the output of the multiplexers in the second tier of each I/O functional unit (step 208).

If the memory is in a test mode, then as indicated in step 210 the multiplexers in the first tiers of the I/O functional units are configured into a scan chain, and in step 212 the latches in the first tier of each I/O functional unit are clocked as a master and slave pair. In this way, as described previously, the I/O functional units are configured as a scan chain so that data stored in the latches may be sequentially read at the output port of the last I/O functional unit in the scan chain.

Figure 3:
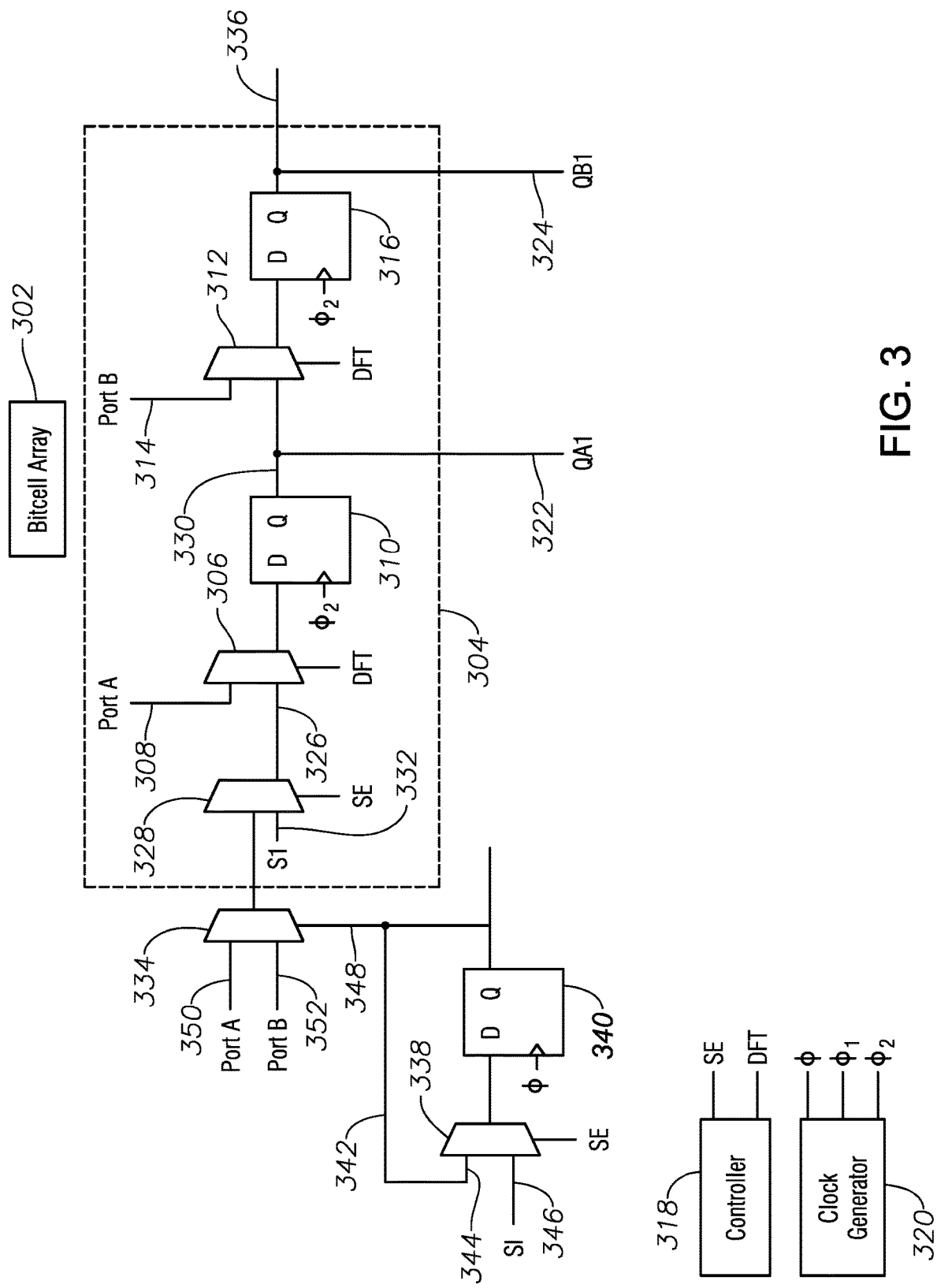
FIG. 3 illustrates a dual-ported memory with a feedback loop in accordance with various implementations described herein.

FIG. 3 illustrates an implementation in which a bitcell array 302 is part of a dual-ported memory, where a first port is referred to as port A and a second port is referred to as port B. Only one I/O functional unit is illustrated, labeled I/O functional unit 304, although in practice there would be multiple I/O functional units, one for each bit that is read from the two ports A and B. The I/O functional unit 304 illustrated in FIG. 3 does not have the two-tier architecture of the I/O functional units in the implementation of FIG. 1.

When in a non-test (or non-scan) mode during normal operation, a multiplexer 306 is configured to select a port A input line 308, where a latch 310 latches the value of the port A input line 308, and a multiplexer 312 is configured to select a port B input line 314, where a latch 316 latches the value of the port B input line 314. A controller 318 provides a control signal DFT to the multiplexers 306 and 312 so that they are configured to select their respective input line during normal operation. As for the implementation of FIG. 1, a clock generator 320 provides clock signals $\phi 1$ and $\phi 2$ to the latches 310 and 316, where the clock signals $\phi 1$ and $\phi 2$ are the same clock signal during normal operation. The value stored in the latch 310 provides to an output port 322 an output bit for port A, denoted as QA1. The value stored in the latch 316 provides to an output port 324 an output bit for port B, denoted as QB1.

During a test (or scan) mode, the controller 318 sets the control signal DFT so that the multiplexer 306 selects an output port 326 of a multiplexer 328, and the multiplexer 312 selects an output port 330 of the latch 310. The controller 318 sets another control signal, denoted as control signal SE, to control the multiplexer 328 to select an input port 332 or the output port of a multiplexer 334. During a test mode, as for the implementation of FIG. 1, the clock generator 320 drives the clock signals $\phi 1$ and $\phi 2$ to be 180° out of phase with respect to each other so that the latches 310 and 316 operate as a master and slave pair, respectively.

An output port 336 of the output latch 316 is connected to a multiplexer in a next I/O functional unit (not shown), where this multiplexer in the next I/O functional unit is the counterpart to the multiplexer 328. Additional I/O functional units are connected in like manner, resulting in a scan chain during a test mode, similar to that of FIG. 1, but where the I/O functional units of FIG. 3 are for a dual-ported bitcell array and do not have a two-tier architecture.

For the test (or scan) mode in which the multiplexer 328 is configured to select the input port 332, labeled S 1, data provided to the input port 332 is shifted through the resulting scan chain, and may be read from an output port of a final I/O functional unit. Other I/O functional units in the resulting scan chain with their corresponding multiplexers that are the counterparts to the multiplexer 328 may be fed with other input data, where this other input data is also shifted through the resulting scan chain and read out at the output port of the final I/O functional unit. In this way, the peripheral circuit is tested.

The controller 318 provides the control signal SE to a multiplexer 338. The combination of the multiplexer 338 in conjunction with a flip-flop 340 and an interconnect 342 form a feedback loop. The interconnect 342 couples the output port of the flip-flop 340 to an input port 344 of the multiplexer 338 to realize the feedback loop when the multiplexer 338 is configured to select the input port 344. An input signal SI at an input port 346 of the multiplexer 338 is used to set the state of the feedback loop, where the state of the feedback loop configures the multiplexer 334 via a select port 348.

For the test (or scan) mode in which the control signal SE configures the multiplexer 328 to select the input port 332, the output of the multiplexer 334 does not affect the scan chain. Note that when the control signal SE configures the multiplexer 328 to select the input port 332, the control signal SE also configures the multiplexer 338 to select the input port 346, so that the feedback loop is not yet active. But when the controller 318 drives the control signal SE to configure the multiplexer 328 to select the output port of the multiplexer 334, the multiplexer 338 is also configured to select the input port 344 so that the feedback loop is now active. In this case, when the clock signal ϕ causes the flip-flop 340 to latch the value of the output of the multiplexer 338, the state of the feedback loop is determined by the value SI on the input port 346. The state of the feedback loop determines whether the multiplexer 334 selects an input port 350 or an input port 352, where the output of the multiplexer 334 is now fed into the scan chain.

The input port 350 is denoted "Port A" to indicate data from port A of the bitcell array 302, and the input port 352 is denoted "Port B" to indicate data from port B of the bitcell array 302. During the test (or scan) mode in which the multiplexer 334 provides its output to the scan chain, either data from Port A or Port B is selected to feed the scan chain. In this way, a single scan chain is used to scan out data from a two-port bitcell array.

Various implementations described herein may be operational with numerous general purpose or special purpose computing system environments or configurations. Examples of computing systems, environments, and/or configurations that may be suitable for use with the various technologies described herein include, but are not limited to, personal computers, server computers, hand-held or laptop devices, multiprocessor systems, microprocessor-based systems, set top boxes, programmable consumer electronics, network PCs, minicomputers, mainframe computers, smart phones, tablets, wearable computers, cloud computing systems, virtual computers, marine electronics devices, and the like.

The various technologies described herein may be implemented in the general context of computer-executable instructions, such as program modules, being executed by a computer. Program modules include routines, programs, objects, components, data structures, etc. that perform particular tasks or implement particular abstract data types. Further, each program module may be implemented in its own way, and all need not be implemented the same way. While program modules may execute on a single computing system, it should be appreciated that, in some implementations, program modules may be implemented on separate computing systems or devices adapted to communicate with one another. A program module may also be some combination of hardware and software where particular tasks performed by the program module may be done either through hardware, software, or some combination of both.

The various technologies described herein may be implemented in distributed computing environments where tasks are performed by remote processing devices that are linked through a communications network, e.g., by hardwired links, wireless links, or various combinations thereof. In a distributed computing environment, program modules may be located in both local and remote computer storage media including, for example, memory storage devices and similar.

Further, the discussion provided herein may be considered directed to certain specific implementations. It should be understood that the discussion provided herein is provided for the purpose of enabling a person with ordinary skill in the art to make and use any subject matter defined herein by the subject matter of the claims. It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of an integrated circuit comprising a controller, a clock generator, a bitcell array with a plurality of bitlines, and a I/O functional unit. The I/O functional unit comprises: a first multiplexer having an output port and is configured to select, depending upon the controller, a first input port or a first bitline among a first group of bitlines in the plurality of bitlines; a first latch having an output port and clocked by the clock generator to latch the output port of the first multiplexer; a second multiplexer having an output port and is configured to select, depending upon the controller, a second input port or a second bitline among a second group of bitlines in the plurality of bitlines, wherein the second input port is coupled to the output port of the first latch; and a second latch having an output port and clocked by the clock generator to latch the output port of the second multiplexer.

Described herein are various implementations of an integrated circuit comprising: a bitcell array comprising a first port and a second port; a first multiplexer having a first input port coupled to the first port of the bitcell array, a second input port coupled to the second port of the bitcell array, an output port, and a select port; a scan chain coupled to the output port of the first multiplexer; a second multiplexer having a first input port, a second input port, and an output port; and a flip-flop having an input port coupled to the output port of the second multiplexer, and an output port connected to the second input port of the second multiplexer and to the select port of the first multiplexer.

Described herein are various implementations of a method comprising: during a normal operating mode of a memory, configuring a first tier of multiplexers to read bitlines of the memory, clocking latches with a same clock signal to latch outputs of the first tier of multiplexers, and reading data from a second tier of multiplexers coupled to the first tier of multiplexers; and during a scan mode of the memory, configuring the first tier of multiplexers into a scan chain by clocking the latches as master and slave pairs.

Reference has been made in detail to various implementations, examples of which are illustrated in the accompanying drawings and figures. Numerous specific details are set forth to provide a thorough understanding of the disclosure provided herein. However, the disclosure provided herein may be practiced without these specific details. In some other instances, well-known methods, procedures, components, circuits, and networks have not been described in detail so as not to unnecessarily obscure details of the implementations.

If one or more circuits are used to realize some or all instances of an implementation, reference may be made to a node or terminal of a circuit or circuit element as an input port or an output port. For a circuit in which a port is a two terminal structure (e.g., circuits modeled as lumped-parameter systems), a recited node or terminal forms one terminal of the two terminal structure, where it is understood that a ground rail (or substrate) serves as another terminal of the two terminal structure.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described herein are disclosed as example forms of implementing the claims.

What is claimed is:

1. A device, comprising:
   a first multiplexer configured to receive a scan signal, receive a first bitline signal, and provide a first multiplexed signal based on the scan signal and the first bitline signal;
   a first latch configured to receive the first multiplexed signal from the first multiplexer, receive a clock signal, and provide a first latched signal based on the first multiplexed signal and the clock signal;
   a second multiplexer configured to receive the first latched signal from the first latch, receive a second bitline signal, and provide a second multiplexed signal based on the first latched signal and the second bitline signal;
   a second latch configured to receive the second multiplexed signal from the second multiplexer, receive the clock signal, and provide a second latched signal based on the second multiplexed signal and the clock signal; and
   a third multiplexer configured to receive the first latched signal, receive the second latched signal, and provide a third multiplexed signal based on the first latched signal and the second latched signal.

2. The device of claim 1, wherein the first multiplexer, the first latch, the second multiplexer, and the second latch are coupled together in series.

3. The device of claim 1, further comprising:
   memory having an array of bitcells coupled to multiple bitlines including a first bitline and a second bitline that is different than the first bitline.

4. The device of claim 3, wherein the memory comprises static random access memory (SRAM), and wherein the bitcells in the array of bitcells comprise SRAM bitcells.

5. The device of claim 3, wherein the first multiplexer is coupled to the first bitline, and wherein the first multiplexer receives the first bitline signal from the first bitline.

6. The device of claim 5, wherein the second multiplexer is coupled to the second bitline, and wherein the second multiplexer receives the second bitline signal from the second bitline.

7. The device of claim 1, further comprising:
   a clock generator that is coupled to the first latch and the second latch,
   wherein the clock generator is configured to generate and provide the clock signal to the first latch and the second latch.

8. The device of claim 1, further comprising:
   a controller that is coupled to the first multiplexer and the second multiplexer, wherein the controller is configured to generate and provide the control signal to the first multiplexer and the second multiplexer.

9. The device of claim 8, wherein the first multiplexer is configured to receive the control signal and provide the first multiplexed signal based on the scan signal, the first bitline signal, and the control signal.

10. The device of claim 9, wherein the second multiplexer is configured to receive the control signal and provide the second multiplexed signal based on the first latched signal, the second bitline signal, and the control signal.

11. The device of claim 10, wherein the third multiplexer is configured to receive the control signal and provide the third multiplexed signal based on the first latched signal, the second latched signal, and the control signal.

12. The device of claim 11, wherein the controller provides the control signal to the first multiplexer, the second multiplexer, and the third multiplexer so as to select and provide a bitline value as an output signal based on the first latched signal from the first latch and the second latched signal from the second latch.

13. A circuit, comprising:
multiple multiplexers including a first multiplexer, a second multiplexer, and a third multiplexer, wherein a first bitline is coupled to a first input port of the first multiplexer, wherein a scan input is coupled to a second input port of the first multiplexer, wherein a second bitline is coupled to a first input port of the second multiplexer, and wherein the third multiplexer is configured to select a bitline value from the first bitline or the second bitline; and
multiple latches including a first latch and a second latch, wherein an output port of the first multiplexer is coupled to a data input port of the first latch, wherein the output port of the first latch is coupled to a first input port of the third multiplexer, wherein an output port of the second multiplexer is coupled to a data input port of the second latch, and wherein a data output port of the second latch is coupled to a second input port of the third multiplexer.

14. The circuit of claim 13, wherein the first latch is coupled between the first multiplexer and the second multiplexer, wherein the second multiplexer is coupled between the first latch and the second latch, wherein the second latch is coupled between the second multiplexer and the third multiplexer, and wherein the second multiplexer and the second latch are coupled in series between the first input port and the second input port of the third multiplexer.

15. The circuit of claim 13, further comprising:
memory having an array of bitcells coupled to multiple bitlines including the first bitline and the second bitline that is different than the first bitline,
wherein the memory comprises static random access memory (SRAM), and
wherein the bitcells in the array of bitcells comprises SRAM bitcells.

16. The circuit of claim 13, wherein:
the first multiplexer receives a first bitline signal via the first input port, receives a scan signal via the second input port, and provides a first multiplexed signal via the output port based on the first bitline signal and the scan signal;
the first latch receives the first multiplexed signal from the first multiplexer via the data input port, receives a clock signal, and provides a first latched signal based on the first multiplexed signal and the clock signal;
the second multiplexer receives a second bitline signal via the first input port, receives the first latched signal from the first latch via the second input port, and provides a second multiplexed signal based on the second bitline signal and the first latched signal;
the second latch receives the second multiplexed signal from the second multiplexer via a data input port, receives the clock signal, and provides a second latched signal via the data output port based on the second multiplexed signal and the clock signal; and
the third multiplexer receives the first latched signal, receives the second latched signal, and provides a third multiplexed signal based on the first latched signal and the second latched signal.

17. The circuit of claim 16, further comprising:
a clock generator that is coupled to the first latch and the second latch,
wherein the clock generator is configured to generate and provide the clock signal to the first latch and the second latch.

18. The circuit of claim 16, further comprising:
a controller that is coupled to the first multiplexer, the second multiplexer, and the third multiplexer,
wherein the controller is configured to generate and provide a control signal to the first multiplexer, the second multiplexer, and the third multiplexer,
wherein the first multiplexer is configured to receive the control signal and provide the first multiplexed signal based on the scan signal, the first bitline signal, and the control signal,
wherein the second multiplexer is configured to receive the control signal and provide the second multiplexed signal based on the first latched signal, the second bitline signal, and the control signal, and
wherein the third multiplexer is configured to receive the first latched signal, receive the second latched signal, and provide the third multiplexed signal based on the first latched signal and the second latched signal.

19. A method, comprising:
using a first multiplexing circuit to receive a scan signal, receive a first bitline signal, and provide a first multiplexed signal based on the scan signal and the first bitline signal;
using a first latching circuit to receive the first multiplexed signal, receive a clock signal, and provide a first latched signal based on the first multiplexed signal and the clock signal;
using a second multiplexing circuit to receive the first latched signal, receive a second bitline signal, and provide a second multiplexed signal based on the first latched signal and the second bitline signal;
using a second latching circuit to receive the second multiplexed signal, receive the clock signal, and provide a second latched signal based on the second multiplexed signal and the clock signal; and
using a third multiplexing circuit to receive the first latched signal, receive the second latched signal, and provide a third multiplexed signal based on the first latched signal and the second latched signal.

* * * * *